United States Patent
Wang et al.

(10) Patent No.: US 9,869,833 B2
(45) Date of Patent: Jan. 16, 2018

(54) OPTICAL RECEIVER USING A PHOTODETECTOR WITH A SELF-ALIGNED LENS

(71) Applicant: Avago Technologies General IP (Singapore) Pte. Ltd., Singapore (SG)

(72) Inventors: Tak Kui Wang, San Jose, CA (US); Ye Chen, San Jose, CA (US); Chung-Yi Su, Fremont, CA (US); Frank Yashar, Cupertino, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/874,221

(22) Filed: Oct. 2, 2015

(65) Prior Publication Data
US 2017/0097480 A1    Apr. 6, 2017

(51) Int. Cl.
| | |
|---|---|
| *H01J 40/14* | (2006.01) |
| *G02B 6/42* | (2006.01) |
| *H01L 31/0232* | (2014.01) |
| *H01L 31/105* | (2006.01) |
| *H04B 10/60* | (2013.01) |

(52) U.S. Cl.
CPC ......... *G02B 6/4238* (2013.01); *G02B 6/4204* (2013.01); *G02B 6/4232* (2013.01); *H01L 31/02327* (2013.01); *H01L 31/105* (2013.01); *H04B 10/60* (2013.01)

(58) Field of Classification Search
CPC ......... G02B 6/12; G02B 6/4204; G02B 6/428
USPC .............................. 250/216, 239; 385/14, 92
See application file for complete search history.

(56) References Cited

U.S. PATENT DOCUMENTS

| | | | |
|---|---|---|---|
| 7,539,366 B1 | 5/2009 | Baks et al. | |
| 8,265,432 B2 | 9/2012 | Doany et al. | |
| 9,413,464 B2 * | 8/2016 | Shi | H04B 10/40 |
| 2012/0063718 A1 | 3/2012 | Steijer et al. | |
| 2014/0321817 A1 | 10/2014 | Wang | |

OTHER PUBLICATIONS

Doany, Fuad, "Power-Efficient, High-Bandwidth Optical Interconnects for High Performance Computing", IBM Corporation, Aug. 23, 2012, 61 pages.

* cited by examiner

*Primary Examiner* — Kevin Pyo
(74) *Attorney, Agent, or Firm* — Sheridan Ross P.C.

(57) ABSTRACT

A constructed photodetector, an optical receiver, and a receiver unit in an optical communication system are disclosed. One example of the disclosed constructed photodetector includes an optoelectronic element having an active area that converts light having a wavelength of interest into electrical signals and a substrate on a face that opposes the active area, where the substrate is non-transparent to light having the wavelength of interest. The constructed photodetector further includes a lens-chip that is at least partially transparent to light having the wavelength of interest, where the lens-chip includes a first side and an opposing second side, where the first side of the lens-chip includes an integrated lens, and where the second side of the lens-chip includes one or more electrical traces. The constructed photodetector further includes at least one connector that provides a physical and electrical connection between the optoelectronic element and the lens-chip.

20 Claims, 10 Drawing Sheets

OPTICAL RECEIVER USING A PHOTODETECTOR WITH A SELF-ALIGNED LENS

FIELD OF THE DISCLOSURE

The present disclosure is generally directed toward optoelectronic devices and, in particular, optical receivers.

BACKGROUND

As data rates increase for optical receivers in fiber optic communication systems, the active area of a photodetector must be reduced. Focusing the light exiting the fiber, particularly multi-mode fiber with a large core, to the photodetector becomes challenging. The lens used to focus the exit beam from the fiber has to produce a very small spot and achieve high precision in position. Monolithically forming a lens in the substrate of a photodetector, which results in high alignment accuracy owing to the use of wafer-level lithography, is not suitable for a photodetector whose substrate is opaque at the operating wavelength of interest.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It is being understood that various changes may be made in the function and arrangement of elements without departing from the spirit and scope of the appended claims.

It is one aspect of the present disclosure to provide an optical receiver that overcomes the above-noted shortcomings. In particular, a flip-chip photodetector having a non-transparent substrate is mounted to a transparent, high-refraction-index material, to produce an integrated detector-lens unit that can be used as part of constructing optical receivers in a multitude of configurations with high alignment accuracy. Furthermore, since the constructed detector-lens unit (e.g., constructed photodetector) is not monolithically formed, the problems associated with using known monolithic techniques are overcome.

As a non-limiting example, a flip-chip PIN-type photodiode is provided with a non-transparent (e.g., opaque) substrate. The flip-chip PIN-type photodiode is flip-chip mounted onto a lens-chip, which is transparent to an operating wavelength of interest for the PIN-type photodiode. In some embodiments, a lens is fabricated on one side of the transparent lens-chip and the lens is aligned to electrodes formed on an opposing side of the transparent lens-chip. High lithography accuracy enables a precise alignment between the lens on one side of the transparent lens-chip and the electrodes on the opposite side of the transparent lens-chip. An active area (e.g., an illumination area responsible for converting light energy into electrical signals) of the PIN-type photodiode is self-aligned to the electrodes on the transparent lens-chip through a solder reflow in the flip-chip bonding process. Accordingly, because the electrodes on the transparent lens-chip are accurately aligned to both the lens and to the active area of the PIN-type photodiode, the active area of the PIN-type photodiode is precisely aligned with the lens of the transparent lens-chip. Continuing the above example and in some embodiments, the transparent lens-chip has a high enough refraction index to produce a desired focusing power with the lens.

In some embodiments, the constructed photodetector manufactured according to the above or other methods may be constructed from a wafer consists of a large array of lens-chips. In particular, the large-scale transparent lens-chip having a plurality of lenses thereon may have a plurality of discrete PIN-type photodiodes connected thereto in a single solder reflow process. After all of the discrete PIN-type photodiodes have been connected to the appropriate areas of the large-scale transparent lens-chip, the large-scale wafer can be singulated (e.g., cut, sawed, etc.) to form a plurality of individual constructed photodetectors. Each of the constructed photodetectors can be deployed as PIN photodiodes with an integrated lens, even though monolithic forming techniques were not used to fully construct the entire constructed photodetector. Thus, each of the constructed photodetectors obtains the benefits of a PIN with an integrated lens without having the shortcomings of monolithically-fabricated photodiodes. Moreover, better and more suitable materials (e.g., Gallium Phosphide (GaP)) can be utilized for the transparent lens-chip to accommodate operation of the optical receiver in higher data rate communication systems. Further still, the constructed photodetectors can be accurately connected to a circuit carrier along with other secondary optics, such as an optical demultiplexer (demux) unit, collimating lens, focusing lens, etc. The secondary optics can be mechanically aligned to the constructed photodetector (and the active area on the PIN-type photodiode) by virtue of self-alignment of the constructed photodetector and the optics-registration-ball to electrodes on the same circuit carrier.

Although embodiments of the present disclosure will be described in connection with an optical receiver of an optical communication system it should be appreciated that the concepts disclosed herein can be applied to optical transmitters of an optical communication system and other optoelectronic environments where optical alignment between discrete components is desired.

Figure 1:
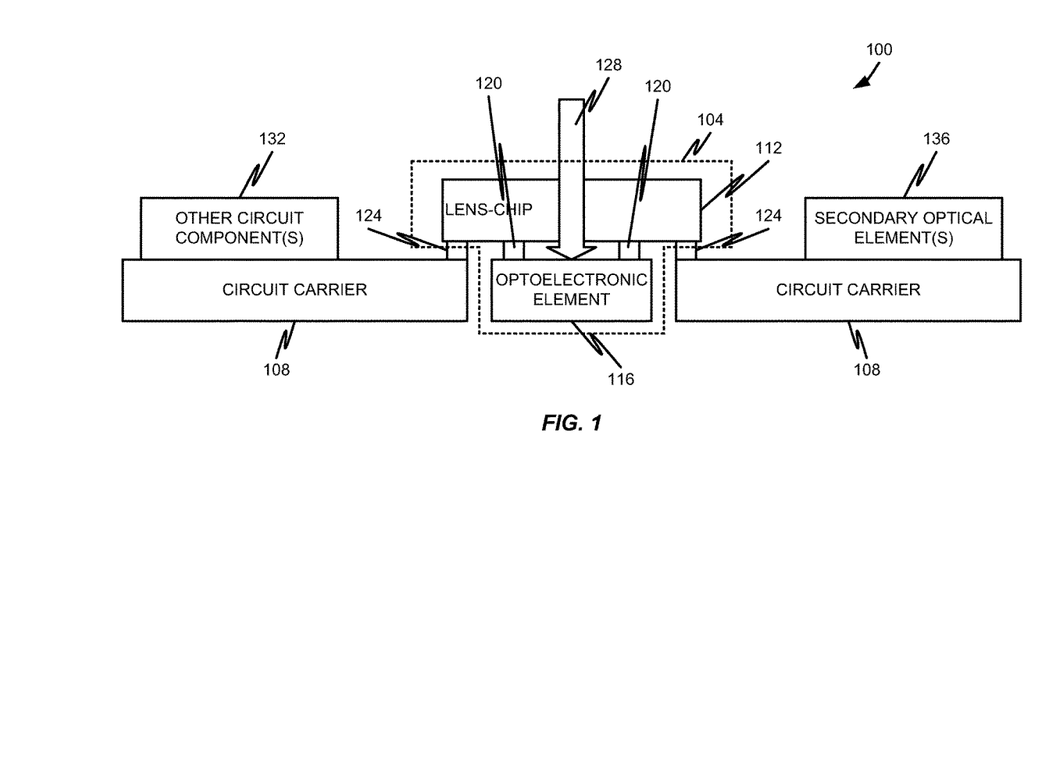
FIG. 1 is a block diagram depicting an optical receiver in accordance with at least some embodiments of the present disclosure.

With reference now to FIG. 1, an illustrative optical receiver 100 that is useable in an optical communication system will be described in accordance with at least some embodiments of the present disclosure. The communication system in which the optical receiver 100 operates may utilize data rates of 20 GHz, 40 GHz, or more. The wavelength of light 128 used in the optical communication system may be longer than 800 nm and, in some embodiments, ranges between approximately 840 nm and 940 nm. Thus, in the above example, "optically transparent" structures of the receiver 100 will be at least partially transparent to light having a wavelength longer than 800 nm and particularly between approximately 840 nm and 940 nm. Conversely, "optically non-transparent" or "opaque" structures of the receiver 100 will not be transparent to light having a wavelength between approximately 840 nm and 940 nm.

The optical receiver 100 is shown to include a circuit carrier 108 that has a constructed photodetector 104, other circuit component(s) 132, and secondary optical element(s) 136 mounted thereto. In some embodiments, the circuit carrier 108 also provides electrical communication mechanisms between the constructed photodetector 104, the other circuit component(s) 132, and/or secondary optical element(s) 136. For instance, the circuit carrier 108 may correspond to a Printed Circuit Board (PCB) or the like having electrically-conductive traces, vias, and/or bonding pads included therein. The circuit carrier 108 may also have one or more alignment mechanisms that facilitate an alignment of the constructed photodetector 104, other circuit component(s) 132, and/or secondary optical element(s) 136 relative to one another.

In some embodiments, the other circuit component(s) 132 can include any type of circuit element or collection of circuit elements. Examples of other circuit component(s) 132 include, without limitation, an Integrated Circuit (IC) chip, resistors, capacitors, inductors, transistors, switches, relays, etc.

The secondary optical element(s) 136 may include any type of optical or optoelectronic element used as part of the optical receiver 100. Non-limiting examples of the secondary optical element(s) 136 include a wavelength demultiplexer, a focusing lens, a collimating lens, combinations thereof, or the like.

The constructed photodetector 104 is shown to include a lens-chip 112 and an optoelectronic element 116 connected to one another via a plurality of first connectors 120. Collectively, the optoelectronic element 116, lens-chip 112, and first connectors 120 form the constructed photodetector 104, which behaves akin to a monolithically-formed photodiode with an integrated lens unit. In some embodiments, rather than using a plurality of first connectors 120, a single first connector 120 can be used to physically connect the constructed photodetector 104 to the circuit carrier 108. In addition to providing a physical union between the constructed lens-chip 112 and optoelectronic element 116, the first connectors 120 can also provide an electrical communication pathway between the lens-chip 112 and optoelectronic element 116. Further still, the first connectors 120 may provide an alignment mechanism between the lens-chip 112 and the optoelectronic element 116. An accurate alignment between the optoelectronic element 116 and lens-chip 112 can be beneficial with respect to directing and/or focusing light 128 that passes through the lens-chip 112 to the optoelectronic element 116.

The constructed photodetector 104 is further connected to the circuit carrier 108 with a plurality of second connectors 124. Again, a single second connector 124 can also be used without departing from the scope of the present disclosure. The second connectors 124 may be similar or identical to the first connectors 120. In some embodiments, the second connectors 124 provide a physical connectivity between the constructed photodetector 104 and the circuit carrier 108. The second connectors 124 may further provide an electrical communication pathway between the constructed photodetector 104 and circuit carrier 108. Further still, the second connectors 124 may provide a highly accurate alignment mechanism between the constructed photodetector 104 and the circuit carrier 108, which in-turn may optically align the constructed photodetector 104 with the secondary optical element(s) 136.

Figure 2:
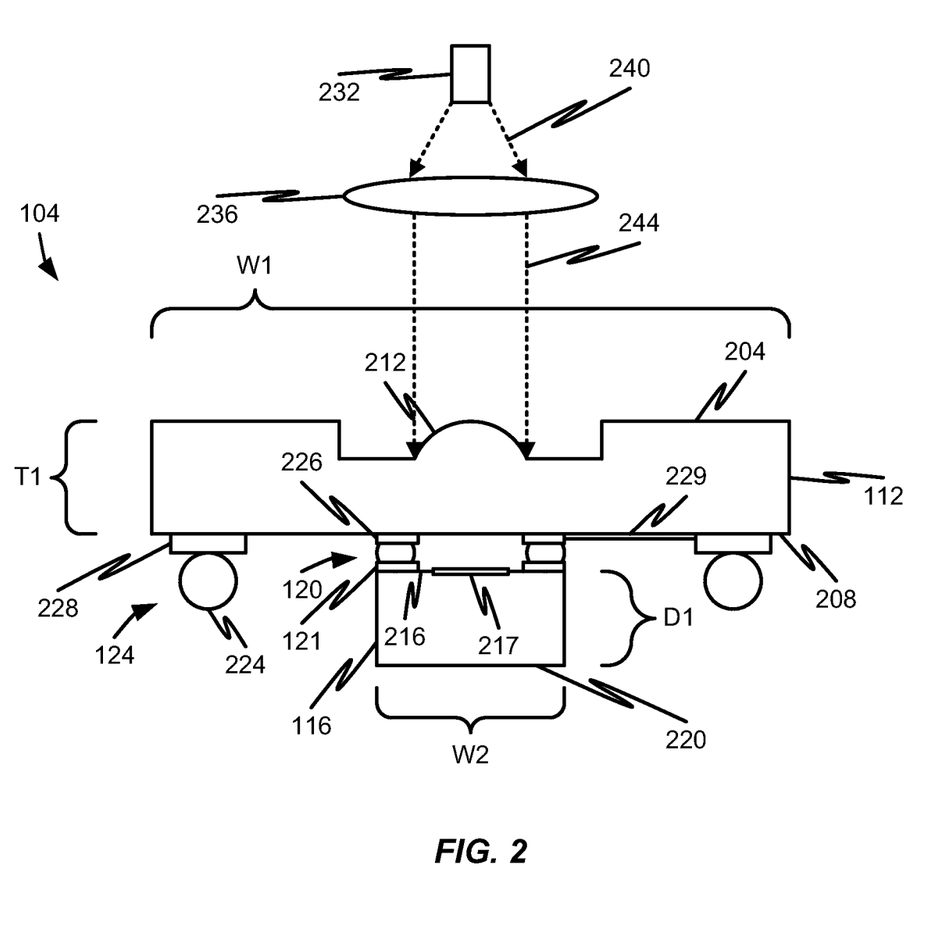
FIG. 2 is a block diagram depicting details of a constructed photodetector in accordance with at least some embodiments of the present disclosure.

With reference now to FIG. 2, additional details of the constructed photodetector 104 will be described in accordance with at least some embodiments of the present disclosure. The constructed photodetector 104 is again shown to include the lens-chip 112 and optoelectronic element 116 connected together with a plurality of first connectors 120.

In some embodiments, the lens-chip 112 corresponds to a chip singulated from a monolithically-formed wafer having at least one lens 212 provided thereon. The lens 212 may correspond to an integrated lens 212, meaning that the integrated lens was integrally formed during construction of the lens-chip 112 (or the wafer from which the lens-chip originated) and there is no material border or boundary between the integrated lens 212 and the rest of the lens-chip 112. In some embodiments, the lens-chip 112 including the integrated lens 212 are constructed of Gallium Phosphide (GaP), which is substantially optically transparent to light having a wavelength between 800 nm and 950 nm. Furthermore, the lens-chip 112 may have an optical index of refraction that is greater than 2.5 at the wavelength of interest (e.g., between 800 nm and 950 nm) along with an electrical resistivity that is greater than 1000 ohm/cm. The lens 212, in some embodiments, corresponds to a refractive lens that is integrally-formed with the lens-chip 112. As an example, the lens 212 may be formed using chlorine-based dry-etching on GaP substrate. Because the lens 212 is integrally formed in the lens-chip 112, the top of the lens 212 is substantially co-planar with the first side 204 of the lens-chip 112. In some embodiments, the top of the lens 212 will be recessed under surface 204 by a small amount, for instance approximately 2 um. This small amount of over etch when forming the lens 212 is useful to guarantee that all the lens 212 on the wafer are etched to completion. In some embodiments, the integrated lens 212 is sized to achieve a focusing of the light 128 onto a first face 216 of the optoelectronic element 116 that is approximately no larger than 13 um and, in some embodiments, is as small as 11 um even though the light is received from a 50 um-core multi-mode fiber. In some embodiments, glass is substantially unable to achieve such a focusing whereas GaP and similar materials are capable of achieving such a focus diameter. Thus, utilization of the constructed photodetector 104 with a GaP lens-chip 112 can help accommodate the desired focusing diameter on the first face 216 of the optoelectronic element 116. In some embodiments, a simple surface can be used to describe the lens. Because of the simple surface, a glass lens with lower refractive index will not be able to focus light into a small spot. However, if a higher order polynomial is used to describe the lens surface, a glass lens can be as effective to focus light into a small spot. Other embodiments of the lens 212 may include a diffractive optic or the like.

In some embodiments, light 240 may originate from an optical fiber 232 or the like, which is collimated by an external lens 236, which may correspond to one example of a secondary optical element 136. The collimated beam of light 244, which travels to and impacts the integrated lens 212. The integrated lens 212 then focuses the collimated beam of light 244 onto an active area 217 of the optoelectronic element 116, which may be smaller in cross-sectional area than the collimated beam of light 244. The active area 217 is established on the first face 216 of the optoelectronic element 116 and converts the incident light into an electrical signal.

In addition to comprising the integrated lens 212, the lens-chip 112 also includes a plurality of solder pads 226 and electrical connectors 121 on a second side 208 that opposes the first side 204. The solder pads 226 and/or first electrical connectors 121 may correspond to lithographically defined features created during construction of the lens-chip 112 or the wafer from which the lens-chip 112 originated. In some embodiments, the use of solder pads 226 only introduces less than 1 um of additional misalignment when a solder-reflow process is used to connect the optoelectronic element 116 to the lens-chip 112 via the first connectors 121. Accordingly, the active area 217 on the first face 216 of the optoelectronic element 116 is aligned with the lens 212 in a substantially comparable way to monolithically-formed photodiodes and lenses. Similarly, the second connectors 124 of the constructed photodetector 104 may comprise the solder pads 228 and solder bumps 224. The position of the solder pads 226 and solder bumps 224 relative to the first connectors 121 may also be carefully controlled during the lithographic creation of the lens-chip 112. Thus, a highly-accurate alignment is achieved between the optoelectronic element 116 and the second connectors 124.

In some embodiments, the lens-chip 112 is approximately 1 mm in wafer width W1 and approximately 150 um in wafer thickness T1. The optoelectronic element 116 is approximately 150 um in detector thickness D1 and 250 um in detector width W2. The relative dimensions of the lens-chip 112 and optoelectronic element 116, however, can be varied without departing from the scope of the present disclosure.

The optoelectronic element 116 may include any type of device having both optical functionality and electrical functionality. In some embodiments, the optoelectronic element 116 comprises a PIN-type photodiode. In some embodiments, the optoelectronic element comprises an Avalanche Photodiode (APD). In some embodiments, the optoelectronic element comprises a Vertical-Cavity Surface-Emitting Laser (VCSEL). In some embodiments, the optoelectronic element comprises an LED or array of LEDs.

The optoelectronic element 116 comprises a first face 216 and a body 220. The first face 216 may include an optically-active area 217 used to convert optical/light energy into electrical signals. The electrical signals produced by the optoelectronic element 116 may be conveyed to the electrical traces 229 of the lens-chip 112 via the first connectors 120. In some embodiments, the first face 216 of the optoelectronic element 116 comprises an active area 217 sized between approximately 18 um and 20 um in diameter. Thus, as an example, the integrated lens 212 and the lens-chip 112 are configured to focus light 128 received from an optical fiber 232 (e.g., at approximately 50 um in diameter) down to less than 18 um and, in some embodiments, less than 13 um onto the first face 216 over a distance slightly larger than 150 um.

The body 220 of the optoelectronic element 116 may comprise a substrate or some other material that is substantially non-transparent/opaque to the wavelength of the light 128 being focused by the integrated lens 212. In some embodiments, the optoelectronic element 116 is flip-chip mounted to the second side 208 of the lens-chip 112, thereby facilitating a close proximity between the first face 216 and the integrated lens 212. This flip-chip bonding can be carried out during a solder-reflow process to achieve a high degree of alignment accuracy between the integrated lens 212 and the first face 216 of the optoelectronic element 116.

Figure 3:
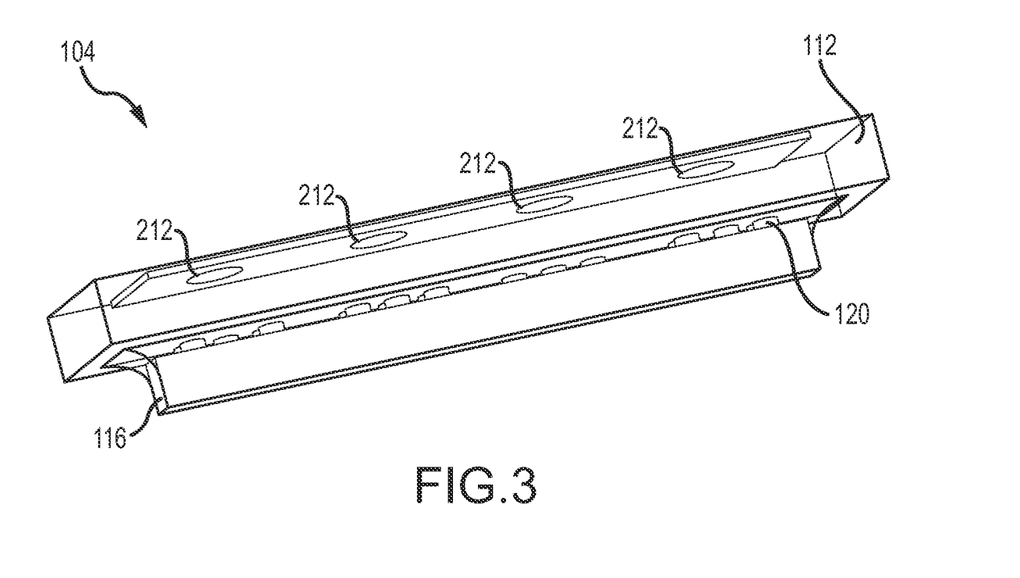
FIG. 3 is an isometric view of an illustrative constructed photodetector in accordance with at least some embodiments of the present disclosure.

As can be seen in FIG. 3, the constructed photodetector 104 may comprise more than one integrated lens 212 in the lens-chip 112. In such embodiments, the optoelectronic element 116 may comprise a plurality of active regions that are each aligned with different ones of the integrated lenses 212. Although the constructed photodetector 104 is shown as including four integrated lenses 212, it should be appreciated that a greater or lesser number of (photodetector 116 maybe attached to multiple lenses 212 on a single integrated lens chip) lenses 212 may be included in a single constructed photodetector 104 without departing from the scope of the present disclosure. As an example, multiple detectors can be provided on a lens chip 112 with multiple lenses.

Figure 4A:
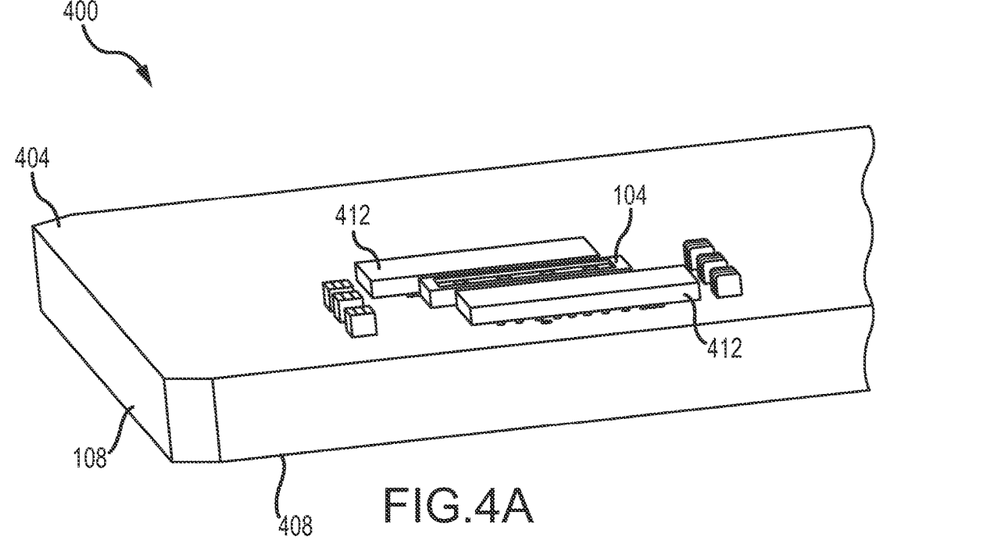
FIG. 4A is a top isometric view of an intermediate device having a constructed photodetector mounted thereto in accordance with at least some embodiments of the present disclosure.
Figure 4B:
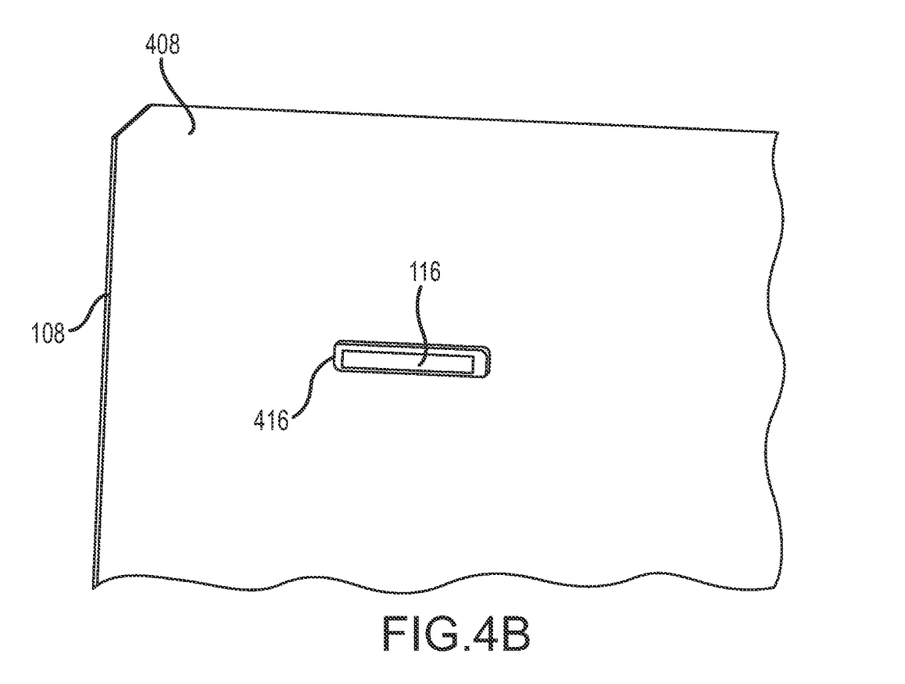
FIG. 4B is a bottom isometric view of the intermediate device of FIG. 4A.

With reference now to FIGS. 4A and 4B, an intermediate optical device 400 comprising a constructed photodetector 104 will be described in accordance with at least some embodiments of the present disclosure. The intermediate device 400 is shown to have the constructed photodetector 104 mounted to a first surface 404 of the circuit carrier 108. The circuit carrier 108 is also shown to include a window 416 that extends as a void between the first surface 404 and an opposing second surface 408 thereof. In the depicted embodiment, the window 416 at least partially receives the optoelectronic element 116 of the constructed photodetector 104 therein.

The intermediate device 400 is also shown to include one or multiple IC chips 412 on its first surface 404. In some embodiments, the IC chips 412 may correspond to examples of other circuit components 132. The IC chips 412 are in electrical communication with the constructed photodetector 104 via electrically-conductive traces on the circuit carrier 108 as well as the second connectors 124 that connect the constructed photodetector 104 to the circuit carrier 108.

Although the circuit carrier 108 is shown in FIGS. 4A and 4B as including a window 416, it should be appreciated that other constructions are envisioned where the circuit carrier 108 does not require a window 416. For instance, instead of a window, it can also be a pocket. The pocket is to accommodate optoelectrical element 116. Note that solder ball 224 can be larger than 120. In that case, the window or pocket may not be required if 116 is thin enough. In addition, the constructed photodetector 104 can be mounted on the IC chips 412, which are mounted to the first surface 404 of the circuit carrier 108. Other configurations of the intermediate device 400 are also possible without departing from the scope of the present disclosure.

Figure 5A:
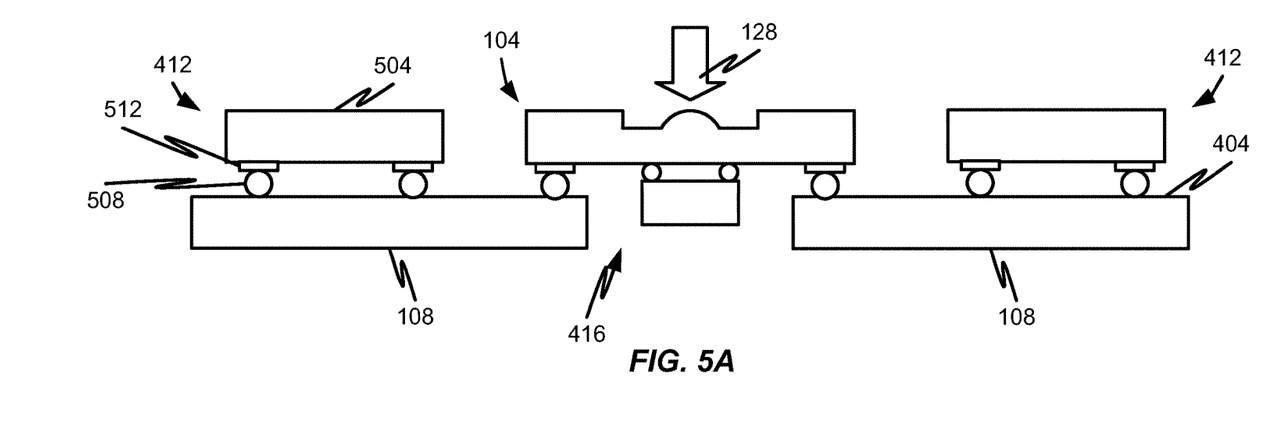
FIG. 5A is a block diagram depicting a first illustrative construction of a constructed photodetector and circuit carrier in accordance with embodiments of the present disclosure.

With reference now to FIGS. 5A-E, examples of such alternative configurations of the intermediate device 400 will be described in accordance with at least some embodiments of the present disclosure. Referring initially to FIG. 5A, a first possible construction of the constructed photodetector 104 and circuit carrier 108 will be described in accordance with at least some embodiments of the present disclosure. The construction of FIG. 5A shows the constructed photodetector 104 being flip-chip bonded to the first surface 404 of the circuit carrier 108. The circuit carrier 108 is also shown to include the window 416, which at least partially receives the optoelectronic element 116 of the constructed photodetector 104. Adjacent to the constructed photodetector 104 are the IC chips 412, which are also flip-chip bonded to the first surface 404 of the circuit carrier 108. In particular, the dies 504 of the IC chips 412 are bonded to the circuit carrier 108 via electrical traces 512 and solder bumps 508. Since the solder bumps 508 and the solder bumps 224 of the second connectors 124 can be precisely aligned relative to one another on the first surface 404 of the circuit carrier 108, the relative alignment of the constructed photodetector 104 and IC chips 412 can be precisely controlled. Furthermore, utilization of flip-chip bonding for the components which are connected to the circuit carrier 108 facilitates a relatively low-profile arrangement for the intermediate device 400, which can result in a lower-profile optical receiver 100. This enables the z-height of secondary optical elements 136 relative to the optoelectronic element 116 to be closely matched and known relative to the first surface 404 of the circuit carrier 108. The z-height of the secondary optical element(s) 136 will depend upon the two solder bumps (e.g., the solder bumps of the first connectors 120 and the second connectors 124). Further still, the circuit carrier 108 may also include electrically-conductive traces that carry electrical signals between the constructed photodiode 104 and the IC chips 412.

Figure 5B:
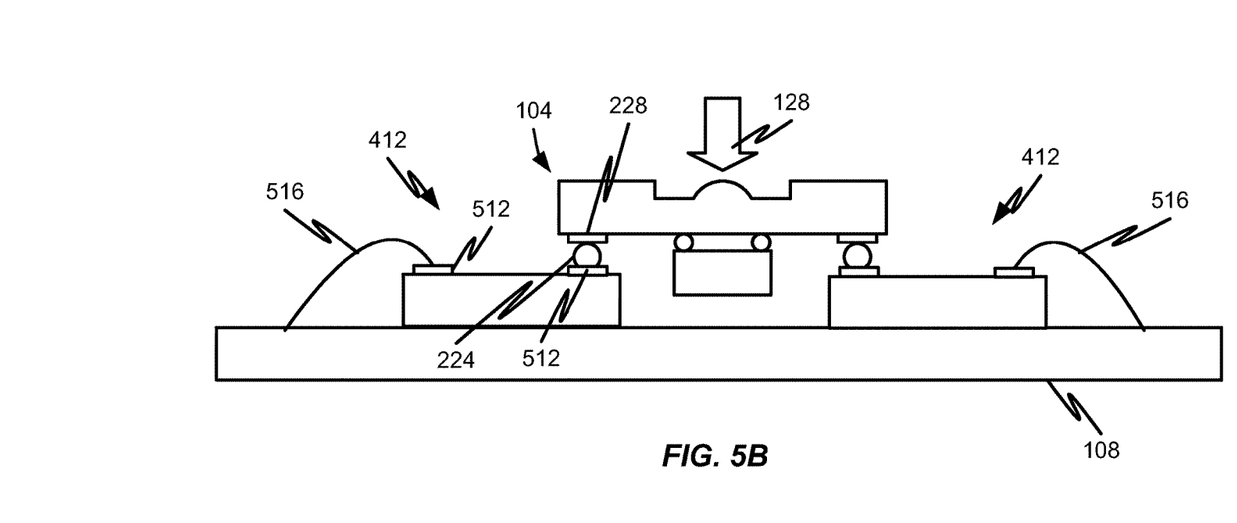
FIG. 5B is a block diagram depicting a second illustrative construction of a constructed photodetector and circuit carrier in accordance with embodiments of the present disclosure.

Referring now to FIG. 5B, a second possible construction of the constructed photodetector 104 and circuit carrier 108 will be described in accordance with at least some embodiments of the present disclosure. The configuration of FIG. 5B shows the constructed photodetector 104 being flip-chip bonded to the IC chips 412, which are, in turn, bonded directly to the circuit carrier 108. In this particular configuration, the constructed photodetector 104 has its traces 228 connected directly to the traces 512 of the IC chip 412 via solder bumps 224. Other traces 512 of the IC chip 412 not occupied by the constructed photodetector 104 are connected to electrical traces on the circuit carrier 108 via one or more wire bonds 516.

One notable difference between the configuration of FIG. 5B and the configuration of FIG. 5A is that the circuit carrier 108 is not required to have a window 416 to accommodate the optoelectronic element 116 of the constructed photodetector 104. While the depicted example shows the constructed photodetector 104 being bonded to a pair of IC chips 412, it should be appreciated that the constructed photodetector 104 may be bonded to a single IC chip 412 or a larger plurality of chips (e.g., three, four, or more IC chips 412). In this particular configuration, the z-height of the secondary optical element(s) 136 will depend upon the sizes of the solder bumps 224 between the optoelectronic element 116 and lens-chip 112 as well as the sizes of the solder bumps 224 between the constructed photodetector 104 and the IC chips 412.

Figure 5C:
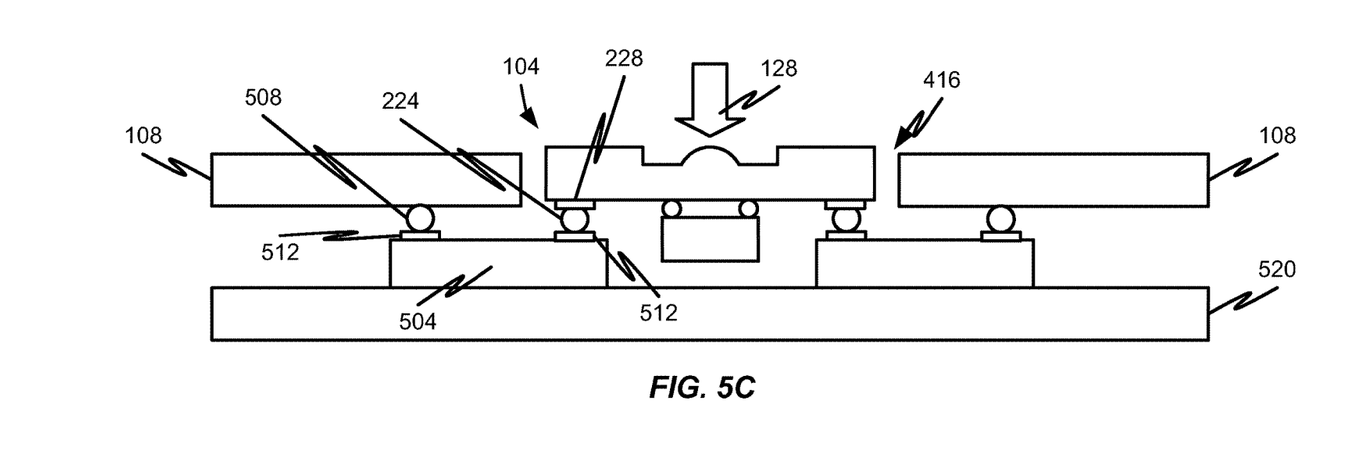
FIG. 5C is a block diagram depicting a third illustrative construction of a constructed photodetector and circuit carrier in accordance with embodiments of the present disclosure.

With reference now to FIG. 5C, yet another possible construction of the constructed photodetector 104 and circuit carrier 108 will be described in accordance with at least some embodiments of the present disclosure. The configuration here utilizes a sub-mount 520 in addition to the circuit carrier 108. The sub-mount may correspond to a mechanical sub-mount that serves as a reference plane for the secondary optical element(s) 136, meaning that the secondary optical element(s) 136 may be mounted to the sub-mount 520 instead of the circuit carrier 108. Here also, the IC chips 412 have one surface of their dies 504 mounted to the sub-mount 520 and their other surfaces flip-chip bonded to the circuit carrier 108 as well as the constructed photodetector 104. In this embodiment, the window 416 of the circuit carrier 108 is sized to receive the larger lens-chip 112 of the constructed photodetector 104.

The constructed photodetector 104 is mounted to the IC chips 512 via traces 228, 512 and solder bumps 224. The other portions of the IC chip 412 are flip-chip bonded to the circuit carrier 108 via traces 512 and solder bumps 508. Here again, the z-height of the secondary optical element(s) 136 will be referenced to the sub-mount 520 and will depend upon the sizes of solder bumps 224, 508, and thickness of 504.

Figure 5D:
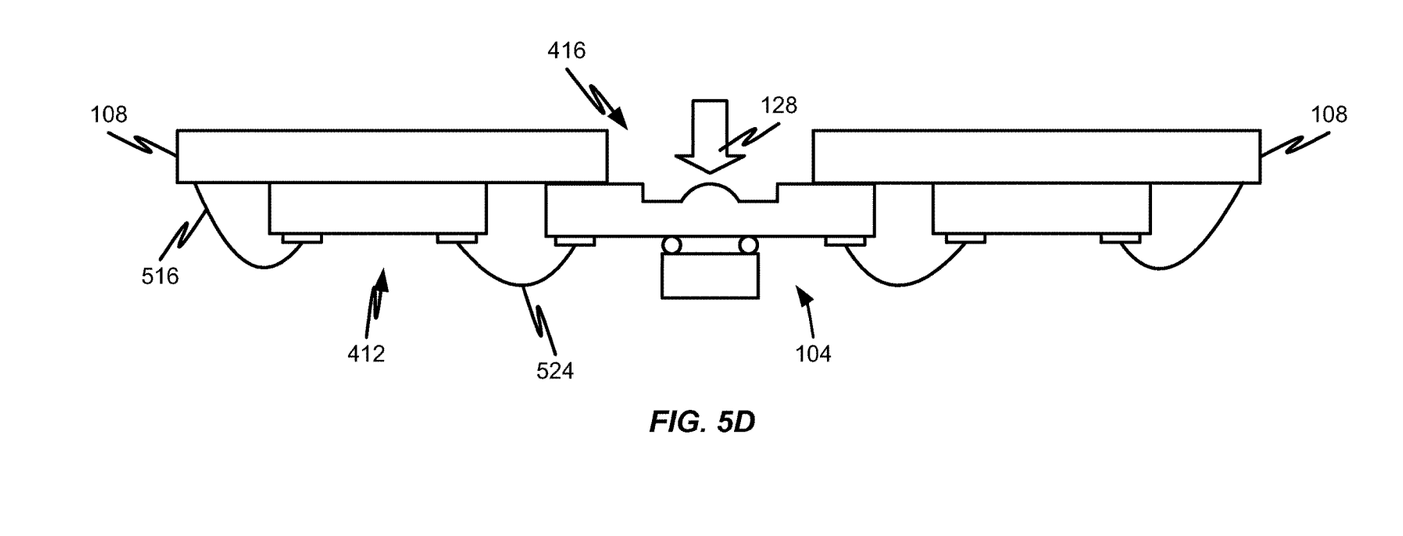
FIG. 5D is a block diagram depicting a fourth illustrative construction of a constructed photodetector and circuit carrier in accordance with embodiments of the present disclosure.

With reference now to FIG. 5D, still another possible construction of the constructed photodetector 104 and circuit carrier 108 will be described in accordance with at least some embodiments of the present disclosure. The construction of FIG. 5D utilizes two sets of wire bonds 516, 524, but achieves a precise z-height alignment between the circuit carrier 108 and optoelectronic element 116 of the constructed photodetector 104. In this embodiment, the constructed photodetector 104 is die-attached to the circuit carrier with its lens 112 facing window 416 in the circuit carrier 108. Moreover, the constructed photodetector 104 has wire bond 524 connections to the IC chips 412, which are also die-attached to the circuit carrier 108. The light signal 128 passes through the window 416 (from the side opposite to the side onto which the constructed photodetector 108 and IC chips 412 are die-attached). This construction provides the advantage of enabling the z-height of the secondary optical element(s) 136 to be referenced directly to the chip-side of the circuit carrier 108, thereby attaining the smallest possible alignment error.

Figure 5E:
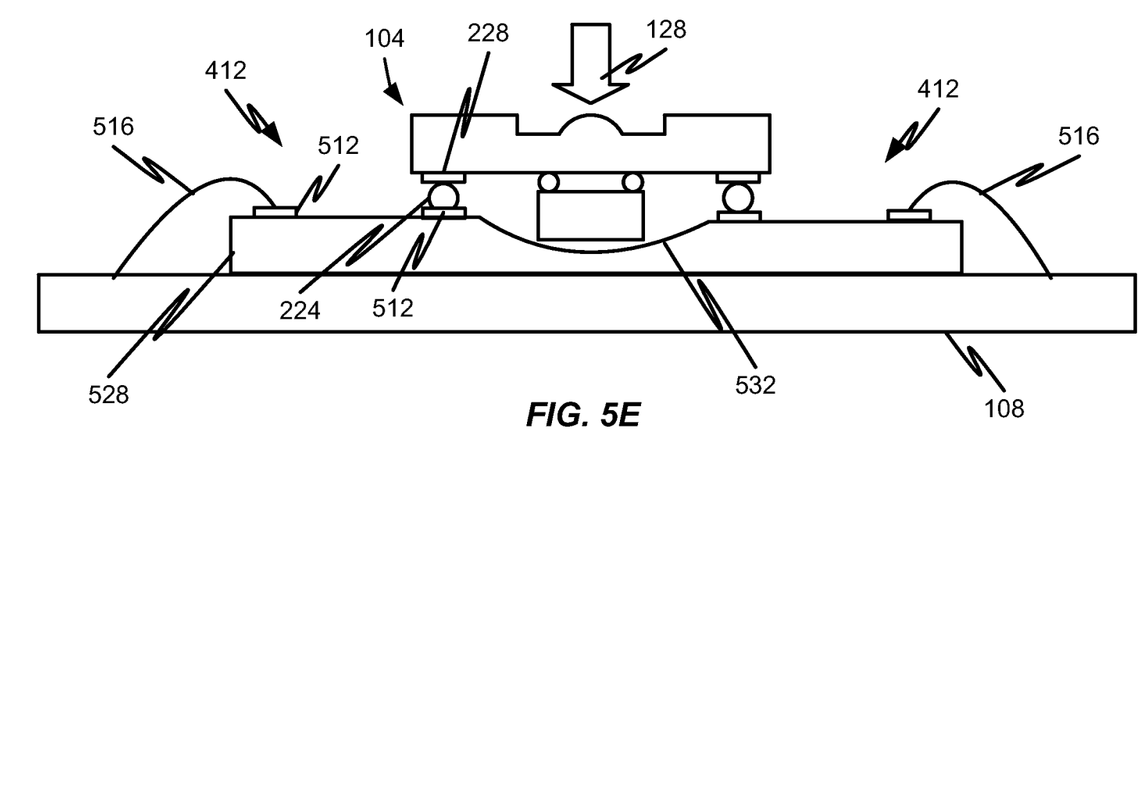
FIG. 5E is a block diagram depicting a fifth illustrative construction of a constructed photodetector and circuit carrier in accordance with embodiments of the present disclosure.

FIG. 5E shows yet another possible construction of the constructed photodetector 104 and circuit carrier 108 in accordance with at least some embodiments of the present disclosure. The construction of FIG. 5E is similar to the construction depicted in FIG. 5B except that a single chip 528 has the constructed photodetector 104 mounted thereto. The single chip 528 may be mounted directly on the circuit carrier 108 and the constructed photodetector 104 may be mounted directly on the single chip 528. The single chip 528 may be similar or identical to other IC chips 412 shown herein or the single chip 528 may comprise a pocket 532 or the like to accommodate the projection of the optoelectronic element 116 of the constructed photodetector 104. In embodiments where the single chip 528 does not comprise the pocket 532, the solder balls 224 and/or other connection components between the constructed photodetector 104 and single chip 528 may be sized sufficiently to create a clearance between the optoelectronic element 116 and the single chip 528.

Figure 6:
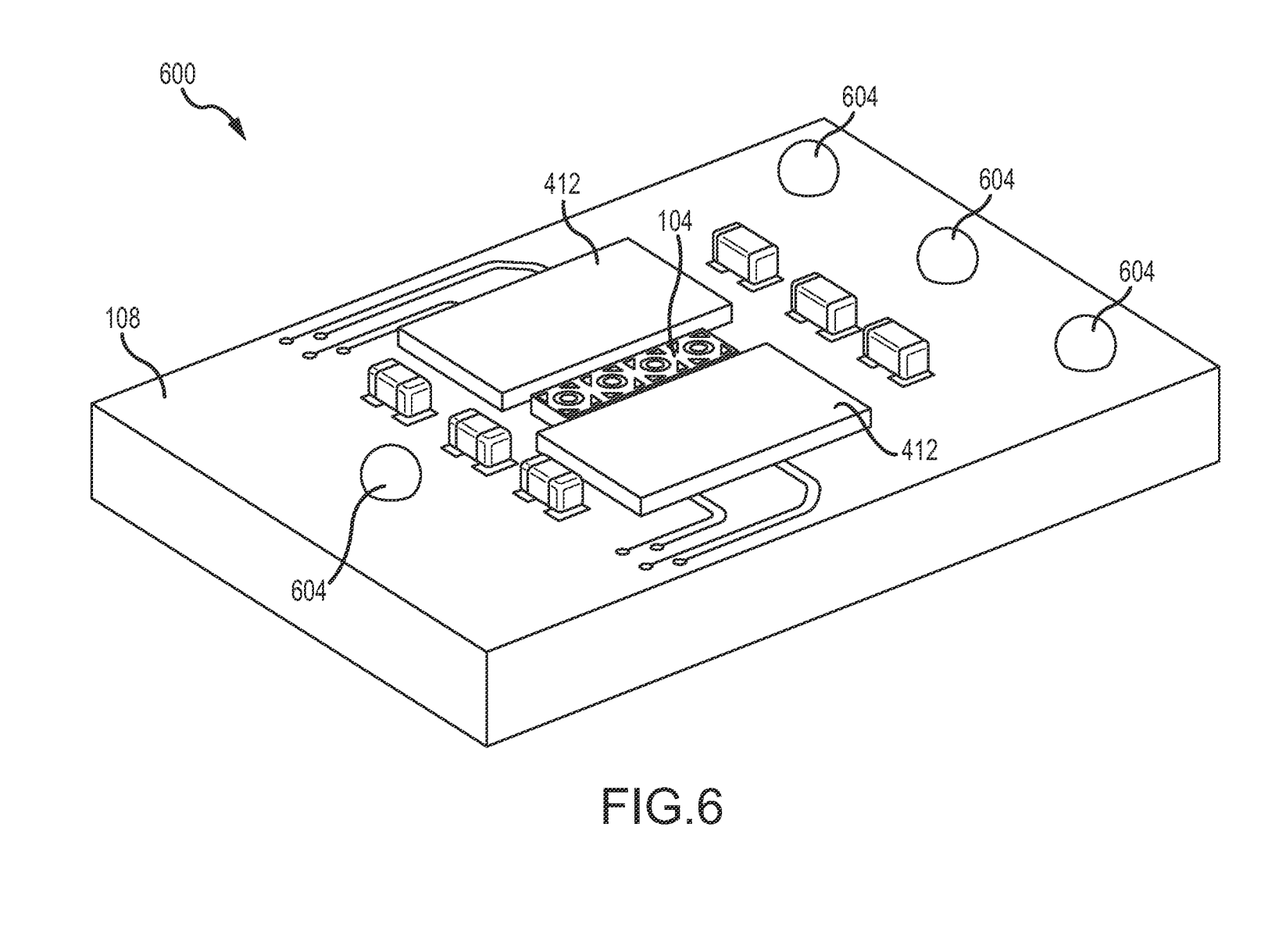
FIG. 6 is a top isometric view of an intermediate device with solder bumps on the circuit carrier in accordance with at least some embodiments of the present disclosure.

With reference now to FIG. 6, further details of another intermediate device 600 will be described in accordance with at least some embodiments of the present disclosure. The intermediate device 600 comprise an unfinished version of the optical receiver 100 where the circuit carrier 108 comprises one or more alignment solder bumps 604 that are on the same surface of the circuit carrier 108 as the IC chips 412 and constructed photodetector 104. The alignment solder bumps 604 can be specifically located on the circuit carrier 108 to enable a precise alignment between the constructed photodetector 104 and secondary optical element(s) 136. Since the alignment solder bumps 604 and the other solder bumps of the second connectors 124 are formed by the same lithography step in the fabrication of the circuit carrier 108, the aperture/active area of the optoelectronic element 116 and the secondary optical element(s) 136 can be aligned with a high degree of accuracy.

Figure 7:
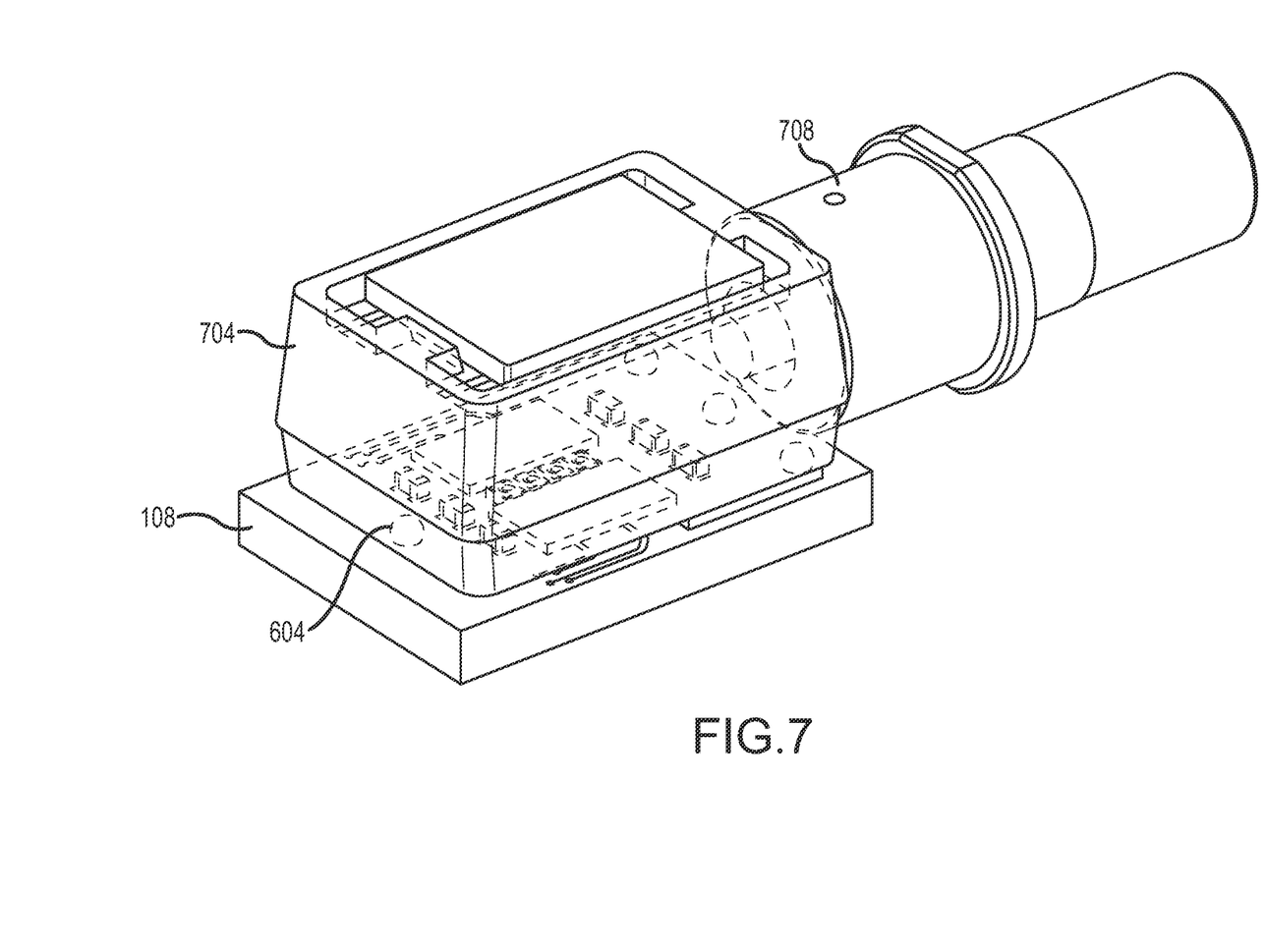
FIG. 7 is a top isometric view of an optical receiver in accordance with at least some embodiments of the present disclosure.

Specifically, as can be seen in FIG. 7, secondary optics 704 can be mechanically aligned to the constructed photodetector 104 via the alignment solder bumps 604 on the circuit carrier 108. As can be appreciated, if constructions such as those depicted in FIGS. 5B-D are used, then the position of the alignment solder bumps 604 may be altered to align the secondary optics 704 with the constructed photodetector 104.

FIG. 7 also depicts how the fiber optics 708 can be connected directly to the secondary optics 704, which subsequently direct light from the fiber optics 708 toward the constructed photodetector 104. Although FIG. 7 shows the secondary optics 704 as corresponding to a specific type of secondary optical element 136 (e.g., a demux unit), it should be appreciated that the receiver 100 may utilize the alignment solder bumps 604 to align the constructed photodetector 104 with other types of secondary optical elements such as collimating lenses, focusing lenses, etc. The same method can be used to align secondary optics to photodetectors that consists of integrated lens.

Figure 8:
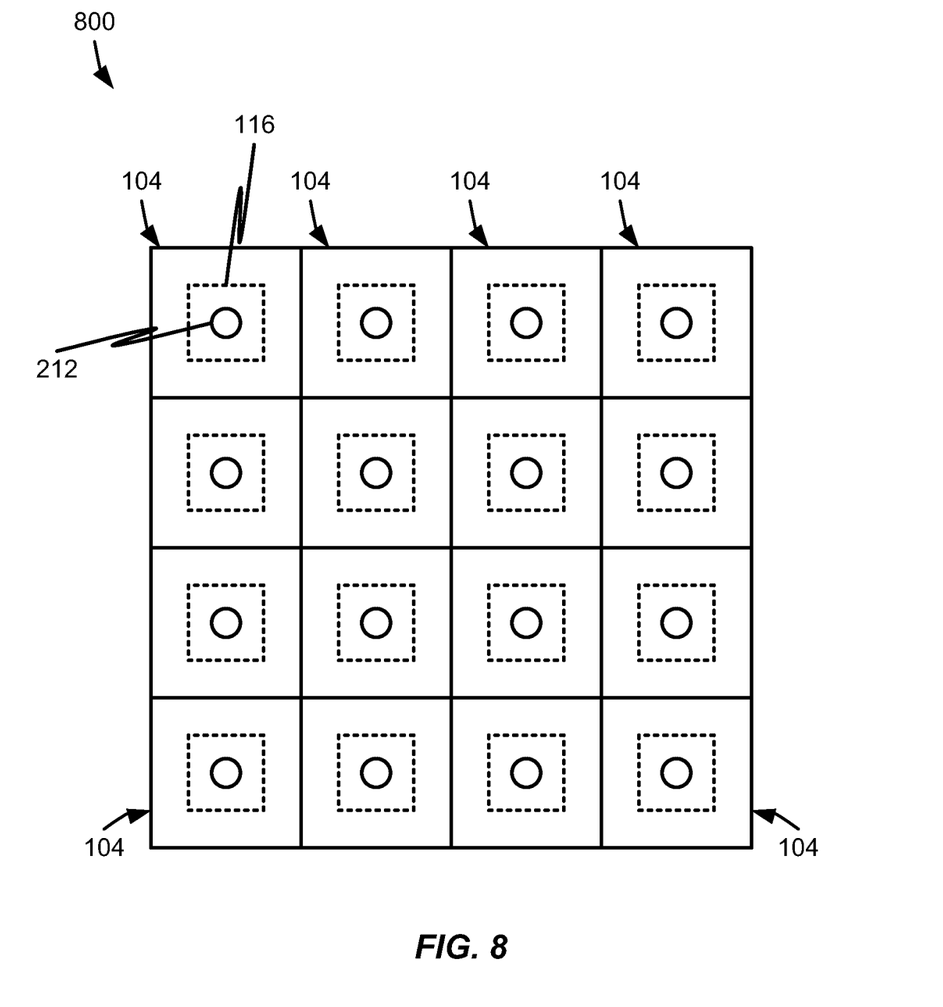
FIG. 8 is a block diagram depicting an array of constructed photodiodes in accordance with at least some embodiments of the present disclosure.

With reference now to FIG. 8, additional details of a construction process for the constructed photodetectors 104 will be described in accordance with at least some embodiments of the present disclosure. In particular, an array of constructed photodetectors 800 is shown prior to individual constructed photodetectors 104 being singulated from the large-scale wafer. In some embodiments, a plurality of constructed photodetectors 104 can be constructed substantially simultaneously by forming a plurality of lenses 212 on one side of the large-scale wafer and then bonding the optoelectronic elements 116 on the opposite side of the large-scale wafer using a solder-reflow process, for example. The array of constructed photodetectors 800 can then be cut or otherwise singulated so that individual ones of the constructed photodetectors 104 are separated from one another so that they can be connected to a circuit carrier 108 or the like. It should be appreciated that any type of fabrication method can be used for the creation of the constructed photodetectors 104 without departing from the scope of the present disclosure.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An optical receiver, comprising:
 a constructed photodetector configured to receive light having a wavelength of interest and convert the received light into electrical signals, the constructed photodetector comprising:
  an optoelectronic element having a first face including an active area that converts the light into electrical signals and a body, wherein the body is substantially opaque to light having the wavelength of interest;
  a lens chip that is at least partially transparent to light having the wavelength of interest, wherein the lens chip comprises a first side and an opposing second side, wherein the first side of the lens-chip comprises a lens, and wherein the second side of the lens-chip comprises one or more electrical traces; and
  at least one connector that provides a physical connection between the first face of the optoelectronic element and the second side of the lens-chip; and
 a secondary optical element mounted to a circuit carrier, wherein the secondary optical element is optically aligned with the lens-chip via solder balls provided on the circuit carrier.

2. The optical receiver of claim 1, wherein electrical signals produced at the first face of the optoelectronic element are carried to the one or more electrical traces of the lens-chip via the at least one connector.

3. The optical receiver of claim 1, wherein the at least one connector provides an optical alignment between the lens of the lens-chip and the active area of the optoelectronic element.

4. The optical receiver of claim 3, wherein the lens is integral to the lens-chip.

5. The optical receiver of claim 1, wherein the circuit carrier is attached to the lens-chip.

6. The optical receiver of claim 5, wherein the solder balls facilitate optical alignment between the secondary optical element and the lens of the lens-chip.

7. The optical receiver of claim 5, wherein the circuit carrier is connected to the lens-chip via at least one bonding wire.

8. The optical receiver of claim 5, wherein the circuit carrier is connected to the lens-chip via one or more connectors, wherein the one or more connectors that connect the circuit carrier to the lens-chip include solder balls that are attached directly to the one or more electrical traces of the lens-chip.

9. The optical receiver of claim 1, wherein the circuit carrier comprises at least one window.

10. The optical receiver of claim 9, wherein the at least one window allows the light to pass therethrough.

11. The optical receiver of claim 9, wherein the at least one window at least partially contains the optoelectronic element therein.

12. The optical receiver of claim 1, wherein the wavelength of interest is greater than 800 nm, wherein the lens-chip comprises Gallium Phosphide, wherein the lens comprises Gallium Phosphide, and wherein the optoelectronic element comprises a PIN photodiode.

13. The optical receiver of claim 1, wherein the optoelectronic element is flip-chip mounted to the lens-chip.

14. A constructed photodetector for use in an optical receiver, the constructed photodetector comprising:
- an optoelectronic element having an active area that converts light having a wavelength of interest into electrical signals and a substrate supporting the active area, wherein the substrate is non-transparent to light having the wavelength of interest;
- a lens-chip that is at least partially transparent to light having the wavelength of interest, wherein the lens-chip comprises a first side and an opposing second side, wherein the first side of the lens-chip comprises an integrated lens, and wherein the second side of the lens-chip comprises one or more electrical traces;
- at least one connector that provides a physical and electrical connection between the optoelectronic element and the lens-chip; and
- a secondary optical element mounted to the at least one connector and aligned with the integrated lens of the lens-chip with a plurality of solder bumps provided on the at least one connector.

15. The constructed photodetector of claim 14, wherein the plurality of solder bumps also connect a face of the optoelectronic element having the active area with the one or more electrical traces of the lens-chip.

16. The constructed photodetector of claim 14, wherein the at least one connector provides an optical alignment between the integrated lens of the lens-chip and the active area of the optoelectronic element.

17. The constructed photodetector of claim 14, wherein the secondary optical element comprises at least one of a wavelength demultiplexer, a focusing lens, and a collimating lens, wherein the wavelength of interest is between 800 nm and 950 nm, wherein the lens-chip comprises Gallium Phosphide, wherein the integral lens is formed via etching, and wherein the optoelectronic element comprises a PIN photodiode.

18. The constructed photodetector of claim 14, wherein the optoelectronic element is flip-chip mounted to the lens-chip.

19. A transceiver unit in an optical communication system, comprising:
- a constructed element configured to receive or produce light having a wavelength of interest, the constructed element comprising:
  - an optoelectronic element having a first face including an active area that converts the light into electrical signals or electrical signals into light and an opposing second face, wherein the second face is substantially opaque to light having the wavelength of interest;
  - a lens-chip that is at least partially transparent to light having the wavelength of interest, wherein the lens-chip comprises a first side and an opposing second side, wherein the first side of the lens-chip comprises an integral lens, and wherein the second side of the lens-chip comprises one or more electrical traces; and
  - at least one connector that provides a physical connection between the first face of the optoelectronic element and the second side of the lens-chip;
- a circuit carrier onto which the constructed element is mounted; and
- a secondary optical element that is also mounted to the circuit carrier and which is optically aligned with the active area via one or more alignment elements.

20. The transceiver unit of claim 19, wherein the one or more alignment elements include at least one of mechanical fittings and solder bumps, wherein the wavelength of interest is between approximately 800 nm and 950 nm, and wherein the optical communication system supports communication data rates of at least 20 GHz.

* * * * *